United States Patent
Kim et al.

(10) Patent No.: US 9,437,419 B2
(45) Date of Patent: Sep. 6, 2016

(54) METHOD OF FORMING A LAYER USING A TRIALKYLSILANE SILICON PRECURSOR COMPOUND

(71) Applicants: Younsoo Kim, Yongin-si (KR); Sangyeol Kang, Suwon-si (KR); Hiroki Sato, Tokyo (JP); Tsubasa Shiratori, Tokyo (JP); Naoki Yamada, Tokyo (JP); Chayoung Yoo, Suwon-si (KR); Younjoung Cho, Hwaseong-si (KR); Chin Moo Cho, Seoul (KR); Jaehyoung Choi, Hwaseong-si (KR)

(72) Inventors: Younsoo Kim, Yongin-si (KR); Sangyeol Kang, Suwon-si (KR); Hiroki Sato, Tokyo (JP); Tsubasa Shiratori, Tokyo (JP); Naoki Yamada, Tokyo (JP); Chayoung Yoo, Suwon-si (KR); Younjoung Cho, Hwaseong-si (KR); Chin Moo Cho, Seoul (KR); Jaehyoung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 232 days.

(21) Appl. No.: 14/173,381

(22) Filed: Feb. 5, 2014

(65) Prior Publication Data
US 2014/0273512 A1    Sep. 18, 2014

(30) Foreign Application Priority Data

Mar. 15, 2013   (KR) .................. 10-2013-0028037

(51) Int. Cl.
| | |
|---|---|
| H01L 21/02 | (2006.01) |
| C23C 16/40 | (2006.01) |
| C23C 16/34 | (2006.01) |
| C23C 16/455 | (2006.01) |
| H01L 49/02 | (2006.01) |

(52) U.S. Cl.
CPC ........... *H01L 21/0217* (2013.01); *C23C 16/34* (2013.01); *C23C 16/401* (2013.01); *C23C 16/45531* (2013.01); *C23C 16/45553* (2013.01); *H01L 21/0228* (2013.01); *H01L 21/02164* (2013.01); *H01L 21/02189* (2013.01); *H01L 21/02211* (2013.01); *H01L 28/40* (2013.01)

(58) Field of Classification Search
CPC .................. H01L 21/02208; H01L 21/02164; H01L 21/0217; C23C 16/401; C23C 16/16
See application file for complete search history.

(56) References Cited

U.S. PATENT DOCUMENTS

| | | | |
|---|---|---|---|
| 6,313,035 B1* | 11/2001 | Sandhu .................. C23C 16/40 257/E21.274 |
| 6,399,208 B1 | 6/2002 | Baum et al. | |
| 6,800,777 B2* | 10/2004 | Arkles ..................... C07F 7/12 556/400 |
| 6,869,638 B2 | 3/2005 | Baum et al. | |
| 7,005,392 B2 | 2/2006 | Baum et al. | |
| 7,084,080 B2 | 8/2006 | Borovik et al. | |
| 7,112,485 B2 | 9/2006 | Vaartstra | |
| 7,771,533 B2 | 8/2010 | Tois et al. | |
| 7,795,160 B2 | 9/2010 | Wang et al. | |
| 8,258,064 B2 | 9/2012 | Lee et al. | |
| 2002/0106891 A1* | 8/2002 | Kim .................. H01L 21/02126 438/624 |
| 2002/0137276 A1* | 9/2002 | Park .................. H01L 21/76802 438/241 |
| 2002/0175393 A1 | 11/2002 | Baum et al. | |
| 2002/0180028 A1 | 12/2002 | Borovik et al. | |
| 2002/0187644 A1 | 12/2002 | Baum et al. | |
| 2003/0188682 A1 | 10/2003 | Tois et al. | |
| 2003/0215970 A1* | 11/2003 | Yang ..................... C23C 16/401 438/30 |
| 2005/0026422 A1* | 2/2005 | Kim .................. H01L 21/76832 438/624 |
| 2006/0228888 A1 | 10/2006 | Lee et al. | |
| 2006/0257563 A1* | 11/2006 | Doh ....................... C23C 16/401 427/248.1 |
| 2008/0012002 A1* | 1/2008 | Sakong ................... H01L 33/06 257/13 |
| 2008/0020593 A1 | 1/2008 | Wang et al. | |
| 2008/0308865 A1* | 12/2008 | Wang ................ H01L 21/28185 257/345 |
| 2010/0252930 A1* | 10/2010 | Liao .................. H01L 21/76807 257/762 |
| 2011/0104907 A1 | 5/2011 | Lee et al. | |
| 2013/0078376 A1 | 3/2013 | Higashino et al. | |

FOREIGN PATENT DOCUMENTS

| | | |
|---|---|---|
| KR | 2008-0101040 A | 11/2008 |
| KR | 2011-0046872 A | 5/2011 |
| KR | 10-1226876 B1 | 3/2012 |
| KR | 10-1216068 B1 | 7/2012 |
| KR | 2012-0078025 A | 7/2012 |

OTHER PUBLICATIONS

Fadeev, Alexander Y., et al., "Trialkylsilane Monolayers Covalently Attached to Silicon Surfaces: Wettability Studies Indicating that Molecular Topography Contributes to Contact Angle Hysteresis". Langmuir 1999, 15, 3759-3766.*

Vijayshankar, Dandapani, et al., "Nanorough silica coatings by chemical vapor deposition". RSC Advances, 2014, 4, 12737-12742.*

Pawlak, M.A. et al., "Enabling 3X nm DRAM: Record low leakage 0.4 nm EOT MIM capacitors with novel stack engineering", Electron Devices Meeting (IEDM), 2010 IEEE International, pp. 11.7.7-11.7.3(2010).

Kazuyuki Tomida et al., "Dielectric constant enhancement due to Si incorporation into HfO2", Applied Physics Letters, pp. 89, 142902(2006).

(Continued)

*Primary Examiner* — Bret Chen
(74) *Attorney, Agent, or Firm* — Harness, Dickey & Pierce, P.L.C.

(57) ABSTRACT

A trialkylsilane-based silicon precursor compound may be expressed by $Si(R^i)X$, $i=1\text{-}3$, where each of "$R^1$", "$R^2$", and "$R^3$" is a hydrogen or an alkyl having 1-5 carbon(s), all of "$R^1$", "$R^2$", and "$R^3$" are not hydrogen, "X" is one of hydrogen, a hydroxyl group, an amide group, an alkoxide group, a halide group, or $Si(R^*)_3$, and "$R^*$" is a hydrogen or an alkyl group having 1~5 carbon(s).

20 Claims, 6 Drawing Sheets

(56) References Cited

OTHER PUBLICATIONS

Dominik Fischer et al., "The effect of dopants on the dielectric constant of HfO2 and ZrO2 from first principles", Applied Physics Letters, pp. 92, 012908(2008).

Kim, M.-S. et al., "Advanced Capacitor Dielectrics: Towards 2x nm DRAM", Memory Workshop (IMW), 2011 3rd IEEE International, pp. 1-4(2011).

"The international Technology Roadmap for Semiconductors", 2011 edition, Front End Processes, pp. 1-52. (http://www.itrs.net).

* cited by examiner

METHOD OF FORMING A LAYER USING A TRIALKYLSILANE SILICON PRECURSOR COMPOUND

CROSS-REFERENCE TO RELATED APPLICATION

This U.S. non-provisional patent application claims priority under 35 U.S.C. §119 to Korean Patent Application No. 10-2013-0028037, filed on Mar. 15, 2013 in the Korean Intellectual Property Office, the disclosure of which is hereby incorporated by reference in its entirety.

BACKGROUND

The inventive concepts relate to trialkylsilane Si precursor compounds, methods of forming a layer using the same, and semiconductor devices.

As semiconductor devices have been increasingly integrated, circuits constituting semiconductor devices have been increasingly finer. For example, sizes of transistors or capacitors are being reduced with high integration of dynamic random access memory (DRAM) devices. However, a cell capacitance should be maintained at the same level or more. In order to increase the cell capacitance, a dielectric constant of a dielectric layer of a capacitor may be increased or a thickness of the dielectric layer may be reduced. However, in this case, a leakage current characteristic of the capacitor may be deteriorated.

Thus, semiconductor devices may require a dielectric layer capable of reducing or minimizing a leakage current and of providing a capacitance over a certain level. Various researches are being conducted for the dielectric layer having the aforementioned characteristics. Additionally, it may be required that atoms constituting the dielectric layer are uniformly distributed in the dielectric layer in order to reduce cell dispersion when the dielectric layer is formed.

SUMMARY

Example embodiments of the inventive concepts relate to silicon precursor compounds capable of improving characteristics of a dielectric layer.

Example embodiments of the inventive concepts relate to methods of forming a layer capable of improving characteristics of a dielectric layer.

Example embodiments of the inventive concepts relate to semiconductor devices including a dielectric layer having improved characteristics.

A precursor compound may include a trialkylsilane-based silicon precursor compound used in a deposition process and expressed by the following chemical formula 1, chemical formula 1

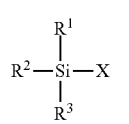

wherein: each of "$R^1$", "$R^2$", and "$R^3$" is a hydrogen or an alkyl having 1~5 carbon(s); all of "$R^1$", "$R^2$", and "$R^3$" are not hydrogen; "X" is one of hydrogen, a hydroxyl group, an amide group, an alkoxide group, a halide group, or $Si(R^*)_3$; and "$R^*$" is a hydrogen or an alkyl group having 1~5 carbon(s).

In example embodiments, all of "$R^1$", "$R^2$", and "$R^3$" may be ethyl groups or propyl groups; and "X" may be hydrogen.

A method of forming a layer may include forming a dielectric layer using a trialkylsilane-based silicon precursor compound expressed by the following chemical formula 1, chemical formula 1

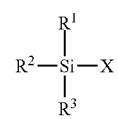

wherein each of "$R^1$", "$R^2$", and "$R^3$" is a hydrogen or an alkyl having 1~5 carbon(s); all of "$R^1$", "$R^2$", and "$R^3$" are not hydrogen; "X" is one of hydrogen, a hydroxyl group, an amide group, an alkoxide group, a halide group, or $Si(R^*)_3$; and "$R^*$" is a hydrogen or an alkyl group having 1~5 carbon(s). The dielectric layer may be a silicon-doped metal oxide layer or a silicon-doped metal nitride layer.

In example embodiments, forming the dielectric layer may include supplying the trialkylsilane-based silicon precursor compound to a substrate to adsorb the trialkylsilane-based silicon precursor compound on a surface of the substrate; and supplying an oxygen-containing gas or a nitrogen-containing gas to react with the trialkylsilane-based silicon precursor compound, thereby forming a first sub-dielectric layer. The first sub-dielectric layer may be a silicon oxide layer or a silicon nitride layer.

In example embodiments, forming the dielectric layer may further include supplying a metal precursor compound to the substrate to adsorb the metal precursor compound on the surface of the substrate; and supplying an oxygen-containing gas or a nitrogen-containing gas to react with the metal precursor compound, thereby forming a second sub-dielectric layer. The second sub-dielectric layer may be a metal oxide layer or a metal nitride layer.

In example embodiments, forming the first sub-dielectric layer may be repeatedly performed m times, where "m" is a positive integer; and the second sub-dielectric layer may be repeatedly performed n times, where "n" is a positive integer different from "m".

In example embodiments, the method may further include performing a thermal treatment to at least diffuse silicon atoms included in the first sub-dielectric layer into the second sub-dielectric layer.

In example embodiments, the oxygen-containing gas may include at least one selected from a group consisting of oxygen ($O_2$), ozone ($O_3$), water vapor ($H_2O$), and nitrous oxide ($N_2O$); and the nitrogen-containing gas may include at least one selected from a group consisting of nitrogen ($N_2$), ammonia ($NH_3$), and hydrazine ($N_2H_4$).

In example embodiments, the metal precursor compound may have a chemical structure expressed by $ML_n$, wherein "M" is one of the elements spanning from lithium (atomic number: 3) to uranium (atomic number: 92); "L" is one of hydrogen, alkyl, aryl, allyl, amide, alkoxide, beta-diketonate, beta-diiminate, dienyl, cyclopentadienyl, or alkylcyclopentadienyl; and "n" is one of 2 to 6.

In example embodiments, the metal precursor compound may have a chemical structure expressed by the following chemical formula 2,

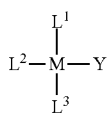

chemical formula 2 wherein "M" is one of titanium, zirconium, or hafnium; and each of "$L^1$", "$L^2$", "$L^3$" and "Y" is one of hydrogen, alkyl, aryl, allyl, amide, alkoxide, beta-diketonate, beta-diiminate, dienyl, cyclopentadienyl, or alkylcyclopentadienyl.

In example embodiments, the trialkylsilane-based silicon precursor compound and the metal precursor compound may have substantially constant deposition rates in the same temperature range.

In example embodiments, the dielectric layer may be used as a gate insulating layer or a capacitor dielectric layer.

In example embodiments, a content of silicon atoms with respect to a total content of metal atoms and silicon atoms in the dielectric layer may be in the range of about 0.5 at % to about 50 at %.

In example embodiments, forming the dielectric layer may be performed by an atomic layer deposition method or an organic metal chemical vapor deposition method.

In example embodiments, forming the dielectric layer may be performed at a temperature of about 200° C. to 400° C.

A semiconductor device may include a dielectric layer and a conductive layer sequentially disposed on a substrate. The dielectric layer may include a metal oxide layer including silicon or a metal nitride layer including silicon. A content of silicon atoms with respect to a total content of metal atoms and silicon atoms may be in the range of about 0.5 at % to about 50 at % in the metal oxide layer including silicon or in the metal nitride layer including silicon.

BRIEF DESCRIPTION OF THE DRAWINGS

The inventive concepts will become more apparent in view of the attached drawings and accompanying detailed description.

DETAILED DESCRIPTION

Figure 1:
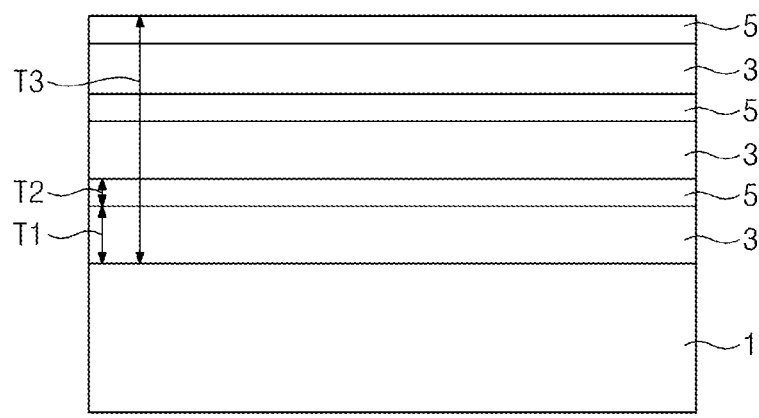
FIGS. 1 and 3 are cross-sectional views illustrating a method of manufacturing a semiconductor device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. In the drawings, embodiments of the inventive concepts are not limited to the specific examples provided herein and may have been exaggerated for clarity.

The terminology used herein is for the purpose of describing example embodiments only and is not intended to limit the present disclosure. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description may have been described with sectional views as idealized views of the inventive concepts. Accordingly, shapes of the example views may be modified according to manufacturing techniques and/or allowable errors. Therefore, example embodiments of the inventive concepts are not limited to the specific shape(s) illustrated in the drawing views, but may include other shapes that may be created according to manufacturing processes. Areas shown in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, example embodiments of the inventive concepts will be described in more detail.

Figure 2:
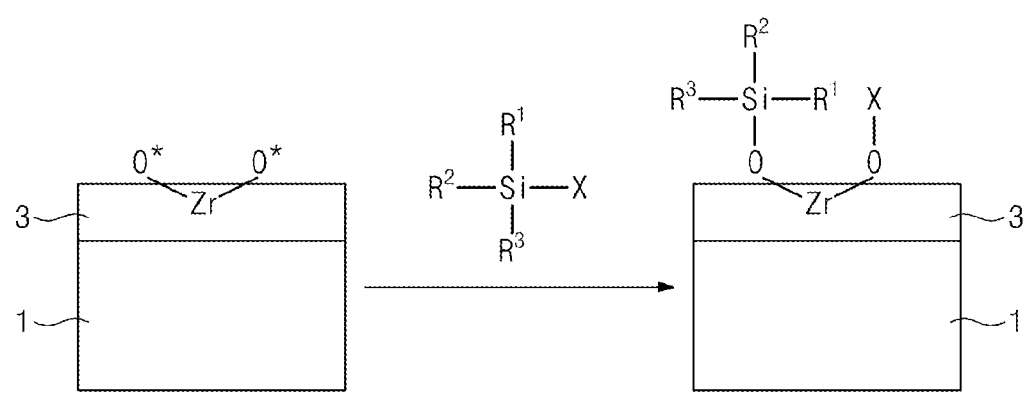
FIG. 2 illustrates an reaction process of a silicon precursor compound on a substrate according to example embodiments of the present disclosure.
Figure 3:
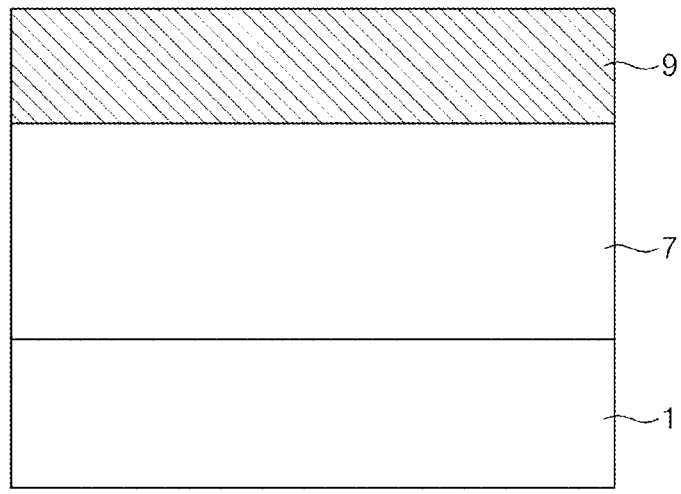

FIGS. 1 and 3 are cross-sectional views illustrating a method of manufacturing a semiconductor device according to example embodiments of the inventive concepts. FIG. 2 illustrates a reaction process of a silicon precursor compound on a substrate according to example embodiments of the present disclosure.

Referring to FIG. 1, a substrate 1 is prepared. The substrate 1 may be, for example, a silicon wafer or a silicon-on-insulator (SOI) substrate. A first sub-dielectric layer 3 is formed on the substrate 1. The first sub-dielectric layer 3 may be a metal oxide layer or a metal nitride layer. A metal included in the first sub-dielectric layer 3 may include at least one selected from a group including lithium (Li), beryllium (Be), sodium (Na), magnesium (Mg), aluminum (Al), potassium (also referred to as kalium) (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), francium (Fr), radium (Ra), and actinium (Ac).

In order to form the first sub-dielectric layer 3, the substrate 1 is loaded into a deposition chamber and then a metal precursor compound is supplied into the deposition chamber. The metal included in the metal precursor compound may include at least one selected from the group described above. In example embodiments, the metal precursor compound may have a chemical structure expressed by $ML_n$, where "M" may be one of the elements spanning from lithium (atomic number: 3) to uranium (atomic number: 92), "L" may be one of hydrogen, alkyl, aryl, allyl, amide, alkoxide, beta-diketonate, beta-diiminate, dienyl, cyclopentadienyl, or alkylcyclopentadienyl, and "n" may be one of 2 to 6.

In particular, the metal precursor compound may have a chemical structure expressed by the following chemical formula 1.

[Chemical formula 1]

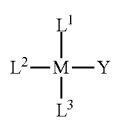

In the chemical formula 1, "M" may be one of titanium, zirconium, or hafnium, and each of "$L^1$", "$L^2$", "$L^3$" and "Y" may be one of hydrogen, alkyl, aryl, allyl, amide, alkoxide, beta-diketonate, beta-diiminate, dienyl, cyclopentadienyl, or alkylcyclopentadienyl.

For example, cyclopentadienyl tris(dimethylamino) zirconium (CTDMAZ; $(C_5H_5)Zr(N(CH_3)_2)_3$) may be used as the metal precursor compound.

The metal precursor compound may be evaporated and supplied into the chamber. The supplied metal precursor compound is adsorbed on a surface of the substrate 1. Subsequently, a metal precursor gas that is not adsorbed on the surface of the substrate 1 is purged to the outside of the chamber. Next, an oxygen-containing gas or a nitrogen-containing gas is supplied into the chamber to react with the metal precursor compound adsorbed on the surface of the substrate, thereby forming a metal oxide layer or metal nitride layer corresponding to one atomic layer. The oxygen-containing gas may include at least one selected from a group including oxygen ($O_2$), ozone ($O_3$), water vapor ($H_2O$), and nitrous oxide ($N_2O$). The nitrogen-containing gas may include at least one selected from a group including nitrogen ($N_2$), ammonia ($NH_3$), and hydrazine ($N_2H_4$). Other ligands combined with the metal (e.g., zirconium) in the metal precursor compound may become combined with the oxygen-containing gas or the nitrogen-containing gas to be converted into gases such as carbon dioxide, water vapor, and/or nitrogen dioxide. These byproducts are purged to the outside of the chamber. This process is repeated m times to form the first sub-dielectric layer 3 having a first thickness T1, where "m" denotes a positive integer.

A second sub-dielectric layer 5 is formed on the first sub-dielectric layer 3. The second sub-dielectric layer 5 may be a silicon oxide layer or a silicon nitride layer. In order to form the second sub-dielectric layer 5, a silicon precursor compound is evaporated and supplied into the chamber. In example embodiments, the supplied silicon precursor compound may have a substantially constant deposition rate in the same deposition temperature range as the metal precursor compound. This is because it may be relatively difficult to change the temperature of the deposition chamber as a process cycle is changed and because a process time may increase to reduce productivity. Additionally, a distribution of elements in a finally formed dielectric layer 7 may not be uniform such that a dispersion of cells may be increased to cause errors. In order to resolve these problems, the silicon precursor compound according to example embodiments of the inventive concepts includes a trialkylsilane-based compound expressed by the following chemical formula 2.

[Chemical formula 2]

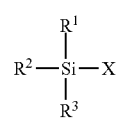

In the chemical formula 2, each of "$R^1$", "$R^2$", and "$R^3$" is a hydrogen or an alkyl having 1~5 carbon(s) and all of "$R^1$", "$R^2$", and "$R^3$" are not hydrogen. In the chemical formula 2, "X" is one of hydrogen, a hydroxyl group, an amide group, an alkoxide group, a halide group, or $Si(R^*)_3$ where "$R^*$" is a hydrogen or an alkyl group having 1~5 carbon(s).

In example embodiments, all of "$R^1$", "$R^2$", and "$R^3$" may be ethyl groups or propyl groups and "X" may be hydrogen. For instance, the silicon precursor compound according to inventive concepts may be triethylsilane (3ES) or tripropylsilane (3PS). The triethylsilane (3ES) or tripropylsilane (3PS) may have a substantially constant deposition rate in a temperature range of about 240° C. to about 300° C.

Additionally, the CTDMAZ $((C_5H_5)Zr(N(CH_3)_2)_3)$ may have a substantially constant deposition rate in the temperature range of about 240° C. to about 300° C. In this case, the deposition process may be performed at a temperature of about 200° C. to about 400° C.

Referring to FIG. 2, if the silicon precursor compound is supplied into the deposition chamber, the silicon precursor compound may be decomposed and then be combined with oxygen of the surface of the first sub-dielectric layer 3. For example, "X" in the chemical formula 2 may be combined with one oxygen combined with zirconium, and silicon in the chemical formula 2 may be combined with another oxygen combined with zirconium. Additionally, since ligands such as "$R^1$", "$R^2$", and "$R^3$" combined with silicon do not react with "X", the silicon precursor compound may be adsorbed in only one type so that a concentration dispersion of silicon may be reduced or minimized. Thus, the trialkylsilane-based silicon precursor compound according to the inventive concepts is suitable to a deposition process, and more particularly, is suitable to an atomic layer deposition (ALD) process.

A silicon precursor compound gas that is adsorbed on the surface of the substrate 1 is purged to the outside of the chamber. Subsequently, the oxygen-containing gas or the nitrogen-containing gas is supplied into the chamber to react with the adsorbed silicon precursor, thereby forming a silicon oxide layer or silicon nitride layer corresponding to one atomic layer. Subsequently, byproducts are purged into the outside of the chamber. This process is repeated n times to form the second sub-dielectric layer 5 having a second thickness T2, where "n" denotes a positive integer.

Referring to FIGS. 1 and 3, the first and second sub-dielectric layers 3 and 5 are alternately and repeatedly formed k times to form a dielectric layer 7 having a desired thickness T3, where "n" denotes a positive integer. In other words, a sum of m times and n times is defined as a super cycle, and the super cycle may be repeatedly performed k times. Next, a thermal treatment is performed at a temperature of about 500 degrees Celsius (° C.) or more to diffuse silicon atoms disposed in the second sub-dielectric layer 5 into the first sub-dielectric layer 3. At this time, metal atoms in the first sub-dielectric layer 3 may be diffused into the second sub-dielectric layer 5. Thus, the dielectric layer 7 may be formed to have a substantially uniform atom distribution. The dielectric layer 7 may be formed of a metal oxide layer or metal nitride layer doped with silicon. The metal oxide layer doped with silicon may be named as a metal silicate.

A conductive layer 9 may be formed on the first and second sub-dielectric layers 3 and 5 at a temperature of about 500° C. or more without an additional thermal treatment. The conductive layer 9 may be, for example, a tungsten layer. The silicon atoms and the metal atoms may be diffused during the formation of the conductive layer 9.

A content of the silicon atoms with respect to a sum of the number of the metal atoms and the number of the silicon atoms in the dielectric layer 7 may be in the range of about 0.5 at % to about 50 at %. In particular, the content of the silicon atoms may be in the range of about 0.5 at % to about 10 at %.

The dielectric layer 7 may correspond to a gate insulating layer or a capacitor dielectric layer of a capacitor. The conductive layer 9 may correspond to a gate electrode or an upper electrode of the capacitor. If the dielectric layer 7 is the capacitor dielectric layer, a lower electrode may be formed before the dielectric layer 7 is formed.

As described above, the dielectric layer 7 may be formed by the atomic layer deposition (ALD) method. Alternatively, the dielectric layer 7 may be formed by an organic metal chemical vapor deposition method using the metal precursor and the silicon precursor described above.

Experimental Example 1

A deposition rate according to a temperature of each of the CTDMAZ, the triethylsilane (3ES), the tripropylsilane (3PS), and tris-dimethylamino silane, (3DMAS; $((CH_3)_2N)_3SiH$) were measured to be represented in FIG. 4. The 3DMAS is a silicon precursor compound used in a conventional deposition process.

Figure 4:
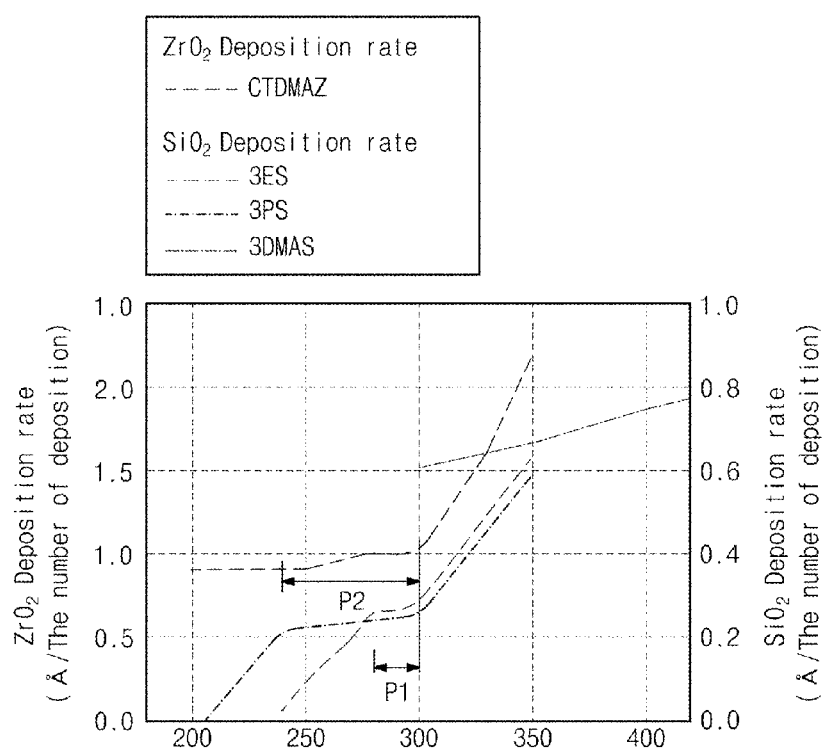
FIG. 4 is a graph illustrating the results of an experimental example 1 according to the inventive concepts.

Referring to FIG. 4, the CTDMAZ and the 3ES had substantially constant deposition rates in a first range P1 of about 280° C. to about 300° C. Additionally, the CTDMAZ and the 3PS had substantially constant deposition rates in a second range P2 of about 240° C. to about 300° C. Thus, it is confirmed that all of the 3ES and 3PS are the silicon precursor compounds suitable to the deposition process. However, the CTDMAZ and the 3DMAS dot not have a temperature range where their deposition rates are substantially constant. Additionally, the deposition rate of the 3DMAS continuously increases according to the temperature. Thus, it is confirmed that the 3DMAS is not suitable to the deposition process.

Experimental Example 2

First substrates and second substrates were prepared. A zirconium oxide layer was repeatedly deposited three times on each of the first and second substrates by using the CTDMAZ. The 3ES according to the inventive concepts was supplied to once deposit a silicon oxide layer on the zirconium oxide layer of each of the first substrates. The conventional 3DMAS was supplied to once deposit a silicon oxide layer on the zirconium oxide layer of each of the second substrates. Supplying times of the silicon precursor compounds (i.e., the 3ES) supplied on the first substrates were 1 second, 5 seconds, 10 seconds, and 20 seconds, respectively. Likewise, supplying times of the silicon precursor compounds (i.e., the 3DMAS) supplied on the second substrates were 1 second, 5 seconds, 10 seconds, and 20 seconds, respectively. Additionally, a content of silicon atoms with respect to total atoms of silicon and zirconium in each of the silicon-doped zirconium oxide layer was obtained and represented in FIG. 5.

Figure 5:
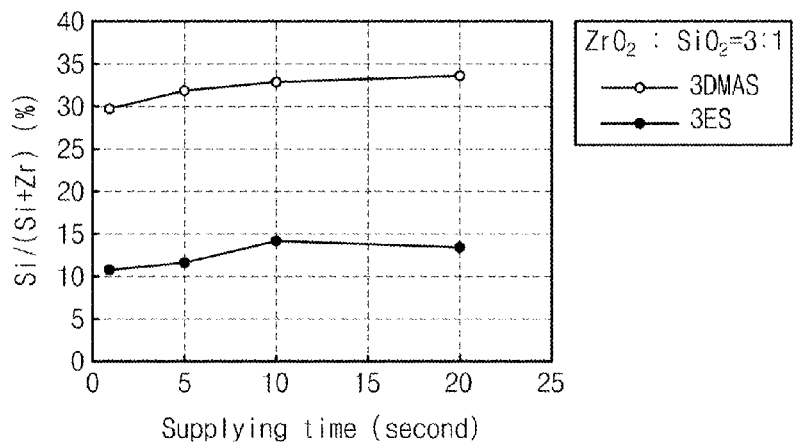
FIG. 5 is a graph illustrating the results of an experimental example 2 according to the inventive concepts.

Referring to FIG. 5, the silicon content of the silicon-doped zirconium oxide layer formed using the conventional 3DMAS continuously increases as the supplying time of the 3DMAS increases. On the contrary, the silicon content of the silicon-doped zirconium oxide layer formed using the 3ES according to the inventive concepts is hardly changed after the supplying time of 10 seconds. Thus, it is confirmed that the silicon content obtained by the ES according to the inventive concepts is saturated after the supplying time of 10 seconds. Additionally, the silicon content of the silicon-doped zirconium oxide layer according to inventive concepts is about ⅓ of the silicon content of the silicon-doped zirconium oxide layer formed using the conventional 3DMAS. Thus, the silicon-doped zirconium oxide layer according to the inventive concepts may have a relatively low-concentration of silicon.

If a silicon-concentration in a silicon-doped metal oxide layer is equal to or less than a specific concentration, a dielectric constant of the silicon-doped metal oxide layer may be substantially uniform and a leakage current characteristic of the silicon-doped metal oxide layer may be more improved than a metal oxide layer that is not doped with silicon. Thus, the thickness of the dielectric layer may be reduced to secure a relatively high capacitance. In this case, the silicon-doped metal oxide layer should maintain a relatively low silicon-concentration (e.g., 10% or less). If the silicon-concentration is relatively high, the dielectric layer may be in an amorphous state such that the dielectric constant of the dielectric layer may be reduced. Thus, it is important that silicon-concentration dispersion is reduced or minimized.

As illustrated in FIG. 5, since the silicon-doped zirconium oxide layer formed using the silicon precursor compound according to the inventive concepts has a relatively low silicon content, the leakage current characteristic of the silicon-doped zirconium oxide layer may be greatly improved. Additionally, the silicon content may be constantly saturated by the silicon precursor compound according to the inventive concepts such that the silicon-concentration dispersion of the silicon-doped metal oxide layer according to the inventive concepts may be reduced or minimized.

Experimental Example 3

Figure 6:
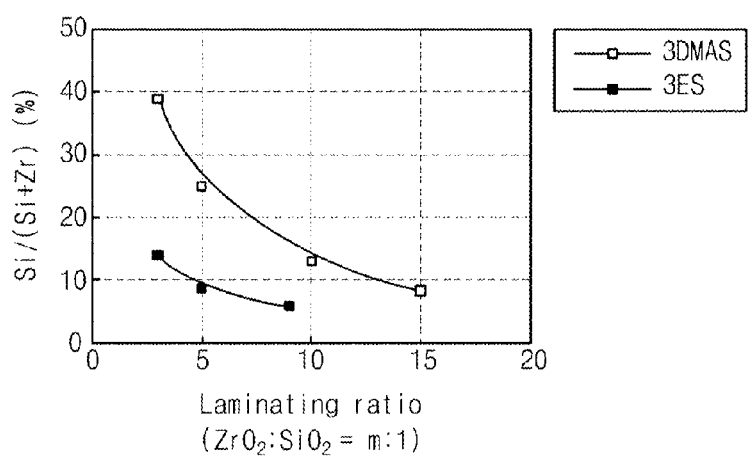
FIG. 6 is a graph illustrating the results of an experimental example 3 according to the inventive concepts.

The silicon oxide layer was deposited once on each of first substrates by using the 3ES of the inventive concepts, and the silicon oxide layer was deposited once on each of second substrates by using the conventional 3DMAS. The zirconium oxide layer was deposited on the silicon oxide layer of each of the first and second substrates by using the CTD-MAZ. At this time, deposited times of the zirconium oxide layers on the first substrates were different from each other, and deposited times of the zirconium oxide layers on the second substrates were different from each other. Silicon contents of finally formed zirconium oxide layers of the first and second substrates were measured and represented in FIG. 6. Referring to FIG. 6, a laminating ratio of the zirconium oxide layer to the silicon oxide layer formed using the 3DMAS was 13:1 in order to secure a silicon-concentration of 10% in the dielectric layer, and a laminating ratio of the zirconium oxide layer to the silicon oxide layer formed using the 3ES was 4:1 in order to secure the silicon-concentration of 10% in the dielectric layer. Additionally, a laminating ratio of the zirconium oxide layer to the silicon oxide layer formed using the 3DMAS was 31:1 in order to secure a silicon-concentration of 5% in the dielectric layer, and a laminating ratio of the zirconium oxide layer to the silicon oxide layer formed using the 3ES was 11:1 in order to secure the silicon-concentration of 5% in the dielectric layer. If the zirconium oxide layer is too thick in the thermal treatment, it may be difficult to uniformly diffuse silicon atoms into the zirconium oxide layer. Thus, a deposition rate of the silicon oxide layer formed by the 3DMAS may be too high so as to be difficult to form the zirconium oxide layer that is uniformly doped with silicon and has a relatively low silicon-concentration.

As described with reference to the experimental examples 1 to 3, the dielectric layers having the uniform and relatively low silicon-concentration were deposited when the silicon precursor compounds of the inventive concepts were used. Additionally, it was confirmed that the silicon-concentration was saturated for a relatively short time when the supplying time of the silicon precursor compound increases.

Experimental Example 4

In the present experimental example 4, a silicon-doped zirconium oxide layer was deposited using the CTDMAZ as the zirconium precursor compound, the 3ES as the silicon precursor compound, and ozone as a reaction gas by a laminate ALD method in common. The CTDMAZ was evaporated at 130° C. and supplied into the deposition chamber and the 3ES was evaporated at 110° C. and supplied into the deposition chamber.

A deposition cycle of the zirconium oxide layer included supplying the CTDMAZ for 10 seconds, purging for 30 seconds, supplying the ozone for 20 seconds, and purging for 20 seconds. A deposition cycle of the silicon oxide layer included supplying the 3ES for 10 seconds, purging for 30 seconds, supplying the ozone for 20 seconds, and purging for 20 seconds.

[Condition 1] Three times of the deposition cycle of the zirconium oxide layer and one time of the deposition cycle of the silicon oxide layer were defined as one super cycle, and the super cycle was repeatedly performed 40 times at a deposition temperature of 280° C. Subsequently, the thermal treatment was performed at 500° C. to form a silicon-doped zirconium oxide layer. In this case, the silicon-concentration (i.e., the content of the silicon atoms to the sum of the silicon atoms and the zirconium atoms) in the silicon-doped zirconium oxide layer was about 14.0%.

[Condition 2] Five times of the deposition cycle of the zirconium oxide layer and one time of the deposition cycle of the silicon oxide layer were defined as one super cycle, and the super cycle was repeatedly performed 40 times at a deposition temperature of 280° C. Subsequently, the thermal treatment was performed at 500° C. to form a silicon-doped zirconium oxide layer. In this case, the silicon-concentration in the silicon-doped zirconium oxide layer was about 8.7%.

[Condition 3] Nine times of the deposition cycle of the zirconium oxide layer and one time of the deposition cycle of the silicon oxide layer were defined as one super cycle, and the super cycle was repeatedly performed 40 times at a deposition temperature of 280° C. Subsequently, the thermal treatment was performed at 500° C. to form a silicon-doped zirconium oxide layer. In this case, the silicon-concentration in the silicon-doped zirconium oxide layer was about 5.9%.

[Condition 4] Three times of the deposition cycle of the zirconium oxide layer and one time of the deposition cycle of the silicon oxide layer were defined as one super cycle, and the super cycle was repeatedly performed 40 times at a deposition temperature of 260° C. Subsequently, the thermal treatment was performed at 500° C. to form a silicon-doped zirconium oxide layer. In this case, the silicon-concentration in the silicon-doped zirconium oxide layer was about 10.7%.

[Condition 5] Three times of the deposition cycle of the zirconium oxide layer and one time of the deposition cycle of the silicon oxide layer were defined as one super cycle, and the super cycle was repeatedly performed 40 times at a deposition temperature of 300° C. Subsequently, the thermal treatment was performed at 500° C. to form a silicon-doped zirconium oxide layer. In this case, the silicon-concentration in the silicon-doped zirconium oxide layer was about 13.4%.

Experimental Example 5

In the present experimental example 5, the 3PS was used as the silicon precursor compound. A silicon-doped zirconium oxide layer was deposited using the CTDMAZ as the zirconium precursor compound, the 3PS as the silicon precursor compound, and ozone as the reaction gas by the laminate ALD method in common. The CTDMAZ was evaporated at 130° C. and supplied into the deposition chamber and the 3PS was evaporated at 110° C. and supplied into the deposition chamber.

The deposition cycle of the zirconium oxide layer included supplying the CTDMAZ for 10 seconds, purging for 30 seconds, supplying the ozone for 20 seconds, and purging for 20 seconds. A deposition cycle of the silicon oxide layer included supplying the 3PS for 10 seconds, purging for 30 seconds, supplying the ozone for 20 seconds, and purging for 20 seconds.

[Condition 6] Three times of the deposition cycle of the zirconium oxide layer and one time of the deposition cycle of the silicon oxide layer were defined as one super cycle, and the super cycle was repeatedly performed 40 times at a deposition temperature of 260° C. Subsequently, the thermal treatment was performed at 500° C. to form a silicon-doped zirconium oxide layer. In this case, the silicon-concentration in the silicon-doped zirconium oxide layer was about 11.3%.

[Condition 7] Three times of the deposition cycle of the zirconium oxide layer and one time of the deposition cycle of the silicon oxide layer were defined as one super cycle, and the super cycle was repeatedly performed 40 times at a deposition temperature of 280° C. Subsequently, the thermal treatment was performed at 500° C. to form a silicon-doped zirconium oxide layer. In this case, the silicon-concentration in the silicon-doped zirconium oxide layer was about 13.1%.

[Condition 8] Three times of the deposition cycle of the zirconium oxide layer and one time of the deposition cycle of the silicon oxide layer were defined as one super cycle, and the super cycle was repeatedly performed 40 times at a deposition temperature of 300° C. Subsequently, the thermal treatment was performed at 500° C. to form a silicon-doped zirconium oxide layer. In this case, the silicon-concentration in the silicon-doped zirconium oxide layer was about 14.7%.

The results of the experimental examples 4 and 5 were shown in the following tables 1 and 2.

TABLE 1

※ $ZrO_2$ deposition cycle:$SiO_2$ deposition cycle = 3:1

| | Deposition temperature | | |
|---|---|---|---|
| | 260° C. | 280° C. | 300° C. |
| Silicon concentration (3ES) | 10.7% | 14.0% | 13.4% |
| Silicon concentration (3PS) | 11.3% | 13.1% | 14.7% |

TABLE 2

※ Deposition temperature: 280° C.

| | Deposition cycle ratio of $ZrO_2$ to $SiO_2$ | | |
|---|---|---|---|
| | 3:1 | 5:1 | 9:1 |
| Silicon concentration (3ES) | 14.0% | 8.7% | 5.9% |

Referring to the table 1, if the 3ES is used as the silicon precursor compound, the silicon-concentration is substantially constant in the temperature range of about 280° C. to about 300° C. If the 3PS is used as the silicon precursor compound, the silicon-concentration slowly increases, however, is substantially constant in the range of about 260° C. to about 300° C.

Referring to the table 2, the deposition cycle ratio of the zirconium oxide layer to the silicon oxide layer is controlled to control the silicon-concentration. In particular, if the deposition cycle ratio of the zirconium oxide layer to the silicon oxide layer is equal to or greater than 5:1, the silicon-concentration may be equal to or less than 10%.

As described above, the dielectric layer is formed using the trialkylsilane-based silicon precursor compounds according to the inventive concepts, thereby improving the characteristics of the dielectric layer. The dielectric layer may be used as the gate insulating layer or the capacitor dielectric layer to improve operating characteristics and reliability of semiconductor devices including the gate insulating layer and/or the capacitor dielectric layer.

The semiconductor devices according to the example embodiments may be encapsulated using various packaging techniques. For example, the semiconductor devices according to the inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to the example embodiments is mounted may further include a controller and/or a logic device that controls the semiconductor memory device.

Figure 7:
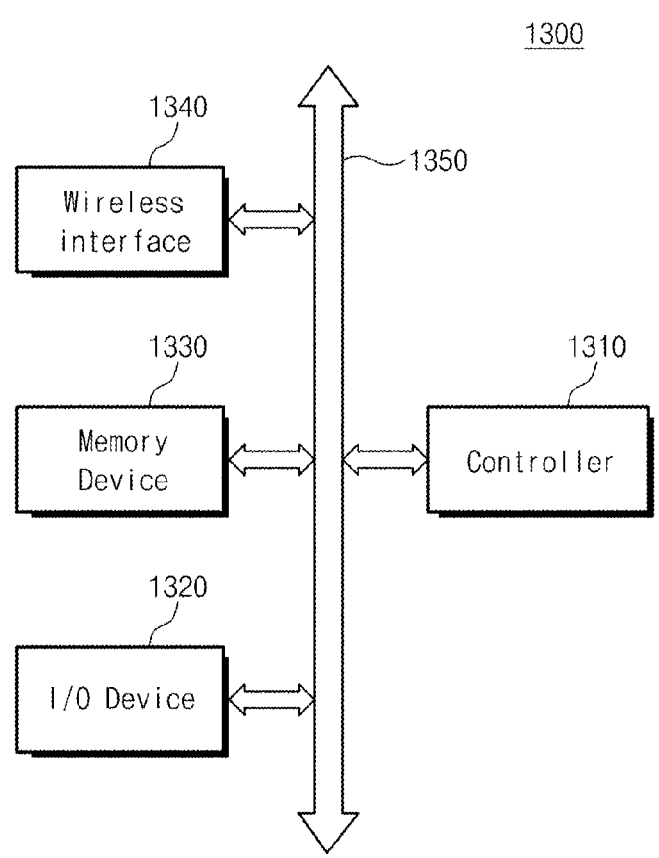
FIG. 7 is a schematic block diagram illustrating an electronic device including a semiconductor device according to example embodiments of the inventive concepts.

FIG. 7 is a schematic block diagram illustrating an electronic device including a semiconductor device according to example embodiments of the inventive concepts.

Referring to FIG. 7, an electronic device 1300 according to example embodiments of the inventive concepts may be one of a personal digital assistant (PDA), a laptop computer, a portable computer, a web tablet, a wireless phone, a mobile phone, a digital music player, a cable/wireless electronic device, and any complex electronic device including at least two thereof. The electronic device 1300 may include a controller 1310, an input/output (I/O) device 1320 (e.g., a keypad, a keyboard and/or a display), a memory device 1330, and a wireless interface unit 1340 which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. Additionally, the memory device 1330 may also be used for storing a user data. The memory device 1330 includes the semiconductor device according to example embodiments of the inventive concepts. The electronic device 1300 may use the wireless interface unit 1340 in order to transmit data to a wireless communication network communicating with a radio frequency (RF) signal or in order to receive data from the network. For example, the wireless interface unit 1340 may include an antenna or a wireless transceiver. The electronic device 1300 may be used in a communication interface protocol such as a third generation communication system (e.g., CDMA, GSM, NADC, E-TDMA, WCDAM, and/or CDMA2000).

Figure 8:
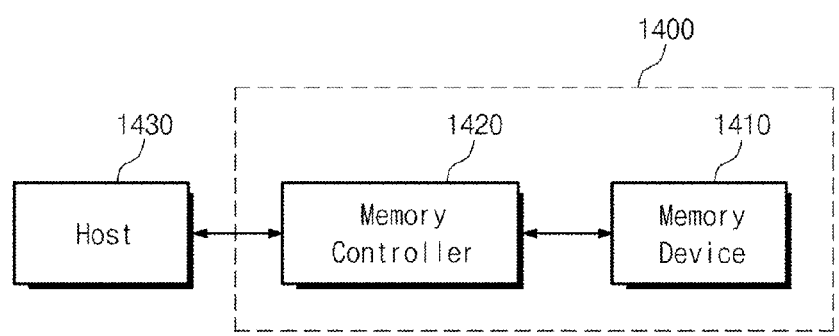
FIG. 8 is a schematic block diagram illustrating a memory system including a semiconductor device according to example embodiments of the inventive concepts.

FIG. 8 is a schematic block diagram illustrating a memory system including a semiconductor device according to example embodiments of the inventive concepts.

Referring to FIG. 8, the semiconductor devices according to example embodiments of the inventive concepts may be used in order to realize a memory system. A memory system 1400 may include a memory device 1410 for storing massive data and a memory controller 1420. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include the semiconductor device according to example embodiments of the inventive concepts.

The trialkylsilane-based silicon precursor compound according to example embodiments of the inventive concepts and the metal precursor compound respectively have substantially constant deposition rates in the same temperature range, such that the trialkylsilane-based silicon precursor compound is suitable to the deposition process for forming the silicon-doped metal oxide layer.

Additionally, the silicon precursor compound according to the inventive concepts is used, such that the silicon content in the finally formed metal oxide layer is low to improve the leakage current characteristic of the semiconductor device. If the finally formed metal oxide layer is applied to the capacitor dielectric layer, the capacitance of the capacitor may be improved. Moreover, the silicon concentration dispersion in the dielectric layer may be reduced to improve the cell dispersion.

While the inventive concepts have been described with reference to example embodiments, it will be apparent to those skilled in the art that various changes and modifications may be made without departing from the spirits and scopes of the inventive concepts. Therefore, it should be understood that example embodiments herein are not limiting, but illustrative. Thus, the scope of the inventive concepts is to be determined by the broadest permissible interpretation of the following claims and their equivalents, and shall not be restricted or limited by the foregoing description.

What is claimed is:

1. A method of forming a layer, the method comprising:
   forming a dielectric layer using a trialkylsilane-based silicon precursor compound expressed by the following chemical formula 1,

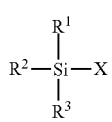

chemical formula 1 wherein each of $R^1$, $R^2$, and $R^3$ is hydrogen or an alkyl having 3~5 carbons; $R^1$, $R^2$, and $R^3$ are not all hydrogen; X is one of hydrogen, a hydroxyl group, an amide group, an alkoxide group, a halide group, or $Si(R^*)_3$; $R^*$ is hydrogen or an alkyl group having 3~5 carbon(s); and the dielectric layer is a silicon-doped metal oxide layer or a silicon-doped metal nitride layer,
   wherein forming the dielectric layer includes alternately forming a first sub-dielectric layer and a second sub-dielectric layer; forming the first sub-dielectric layer includes forming m atomic layers of a metal oxide layer or a metal nitride layer; forming the second sub-dielectric layer includes forming n atomic layers of a silicon oxide layer or a silicon nitride layer; and m and n are positive integers, and
   wherein the forming n atomic layers includes repeating n times:
     supplying the trialkylsilane-based silicon precursor compound to a substrate such that the trialkylsilane-based silicon precursor compound is adsorbed onto the substrate; and
     supplying the oxygen-containing gas or the nitrogen-containing gas to react with the trialkylsilane-based silicon precursor compound to form one atomic layer of the silicon oxide layer or the silicon nitride layer.

2. The method of claim 1, wherein all of $R^1$, $R^2$, and $R^3$ are propyl groups; and X is hydrogen.

3. The method of claim 1, wherein the forming m atomic layers includes repeating m times:
   supplying a metal precursor compound to the substrate such that the metal precursor compound is adsorbed onto the substrate; and
   supplying an oxygen-containing gas or a nitrogen-containing gas to react with the metal precursor compound to form one atomic layer of the metal oxide layer or the metal nitride layer.

4. The method of claim 3, wherein m is different from n.

5. The method of claim 3, further comprising:
   performing a thermal treatment to diffuse at least silicon atoms included in the second sub-dielectric layer into the first sub-dielectric layer.

6. The method of claim 3, wherein the oxygen-containing gas includes at least one of oxygen ($O_2$), ozone ($O_3$), water vapor ($H_2O$), and nitrous oxide ($N_2O$); and the nitrogen-containing gas includes at least one of nitrogen ($N_2$), ammonia ($NH_3$), and hydrazine ($N_2H_4$).

7. The method of claim 3, wherein the metal precursor compound has a chemical structure expressed by $ML_n$; M being an element with an atomic number spanning from 3 to 92; L being hydrogen, alkyl, aryl, allyl, amide, alkoxide, beta-diketonate, beta-diiminate, dienyl, cyclopentadienyl, or alkylcyclopentadienyl; and n being a number ranging from 2 to 6.

8. The method of claim 3, wherein the metal precursor compound has a chemical structure expressed by the following chemical formula 2,

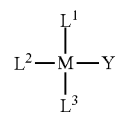

chemical formula 2

M being titanium, zirconium, or hafnium; and each of $L^1$, $L^2$, $L^3$, and Y being one of hydrogen, alkyl, aryl, allyl, amide, alkoxide, beta-diketonate, beta-diiminate, dienyl, cyclopentadienyl, or alkylcyclopentadienyl.

9. The method of claim 3, wherein the trialkylsilane-based silicon precursor compound and the metal precursor compound have substantially constant deposition rates in a same temperature range.

10. The method of claim 1, wherein the dielectric layer is used as a gate insulating layer or a capacitor dielectric layer.

11. The method of claim 1, wherein a content of silicon atoms with respect to a total content of metal atoms and the silicon atoms in the dielectric layer is in the range of about 0.5 at % to about 50 at %.

12. The method of claim 1, wherein forming the dielectric layer is performed by an atomic layer deposition method or an organic metal chemical vapor deposition method.

13. The method of claim 1, wherein forming the dielectric layer is performed at a temperature of about 200° C. to 400° C.

14. A method of forming a dielectric layer, comprising:
forming a first sub-dielectric layer of a metal oxide or a metal nitride;
forming a second sub-dielectric layer of a silicon oxide or a silicon nitride on the first sub-dielectric layer using a trialkylsilane-based silicon precursor compound expressed by the following chemical formula 1,

chemical formula 1 wherein each of $R^1$, $R^2$, and $R^3$ is hydrogen or an alkyl having 3~5 carbons; $R^1$, $R^2$, and $R^3$ are not all hydrogen; X is one of hydrogen, a hydroxyl group, an amide group, an alkoxide group, a halide group, or $Si(R^*)_3$; $R^*$ is hydrogen or an alkyl group having 3~5 carbons; and
heat treating the first sub-dielectric layer and the second sub-dielectric layer to diffuse silicon atoms from the second sub-dielectric layer into the first sub-dielectric layer.

15. The method of claim 14, wherein the forming a first sub-dielectric layer and the forming a second sub-dielectric layer are alternately performed a plurality of times.

16. The method of claim 14, wherein the heat treating is performed at a temperature of about 500 degrees Celsius or more.

17. The method of claim 14, wherein the heat treating further includes diffusing metal atoms from the first sub-dielectric layer into the second sub-dielectric layer.

18. The method of claim 14, wherein the heat treating is performed so as to achieve a substantially uniform distribution of the silicon atoms in the dielectric layer, the dielectric layer being a combination of the first sub-dielectric layer and the second sub-dielectric layer.

19. The method of claim 18, wherein the heat treating is performed such that the dielectric layer is in a form of a metal silicate.

20. The method of claim 18, wherein the heat treating is performed such that a content of the silicon atoms with respect to a total content of the silicon atoms and metal atoms in the dielectric layer is in a range of about 0.5 at % to about 50 at %.

* * * * *